(12) United States Patent
Tagore-Brage et al.

(10) Patent No.: US 9,058,450 B1
(45) Date of Patent: Jun. 16, 2015

(54) EFFICIENTLY USING CELL LIBRARIES WITH A LARGE NUMBER OF CELLS

(75) Inventors: Jens Peter Tagore-Brage, Frederiksberg (DK); Ole Christian Anderson, San Mateo, CA (US)

(73) Assignee: Nangate Inc., Santa Clara, CA (US)

( * ) Notice: Subject to any disclaimer, the term of this patent is extended or adjusted under 35 U.S.C. 154(b) by 60 days.

(21) Appl. No.: 13/487,657

(22) Filed: Jun. 4, 2012

Related U.S. Application Data

(60) Provisional application No. 61/493,300, filed on Jun. 3, 2011, provisional application No. 61/493,305, filed on Jun. 3, 2011.

(51) Int. Cl.
 *G06F 17/50* (2006.01)
(52) U.S. Cl.
 CPC ................... *G06F 17/5045* (2013.01)

(58) Field of Classification Search
 USPC .................................................. 716/100–104
 See application file for complete search history.

(56) References Cited

U.S. PATENT DOCUMENTS

| | | | |
|---|---|---|---|
| 2009/0210848 A1* | 8/2009 | Cox | 716/12 |
| 2011/0033787 A1* | 2/2011 | Lin et al. | 430/30 |
| 2012/0181669 A1* | 7/2012 | Lin et al. | 257/620 |

* cited by examiner

*Primary Examiner* — Binh Tat
(74) *Attorney, Agent, or Firm* — Aka Chan LLP

(57) ABSTRACT

Techniques for using subcell libraries allow efficient handling of a large number of cells. To improve design accuracy using cell libraries, very large cell libraries are needed. However, optimization tools are not able to use very large cell libraries directly, since their results suffer. Very large cell libraries are organized into sublibraries that are adapted to be processed by optimization tools. This allows improvement in the design quality of integrated circuits, while allowing the designs to be processed by optimization tools.

19 Claims, 12 Drawing Sheets

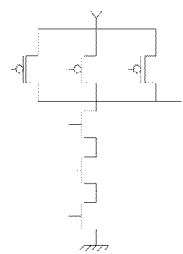 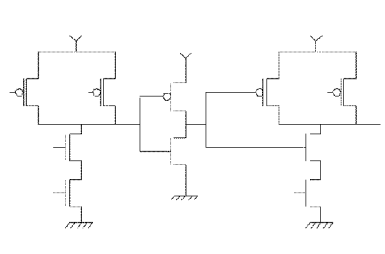 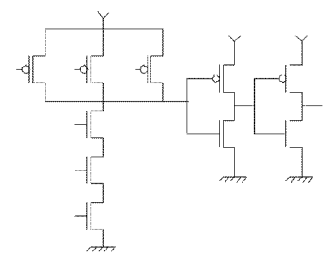
Figure 9A　　　Figure 9B　　　Figure 9C
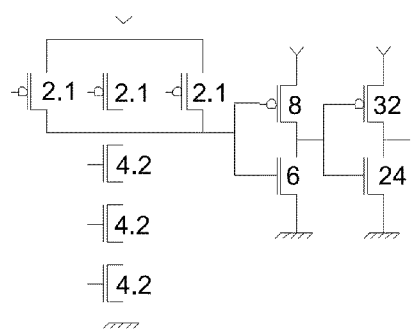 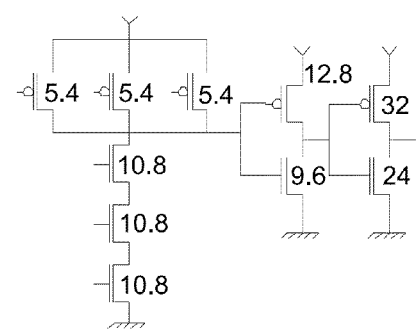
Figure 10A　　　Figure 10B

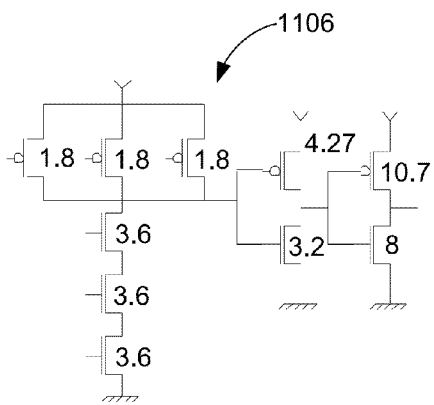
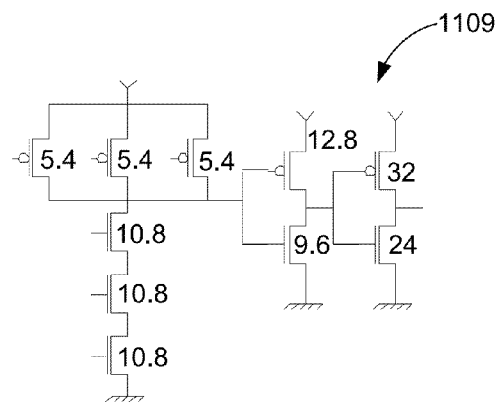
Figure 11A　　　　　Figure 11B
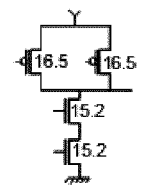
Reference: P/N
scale factor = 1
P/N=1.0855
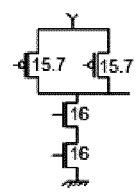
P/N scale
factor = 0.9
P/N=0.9770
Figure 12A　　　　　Figure 12B
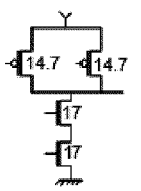
P/N scale
factor = 0.8
P/N=0.8684
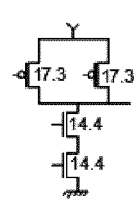
P/N scale
factor = 1.1
P/N=1.1941
Figure 12C　　　　　Figure 12D X1, P/N sf=0.9

X1, P/N sf=1

X1, P/N sf=1.1

X2, P/N sf=0.9

X2, P/N sf=1

X2, P/N sf=1.1

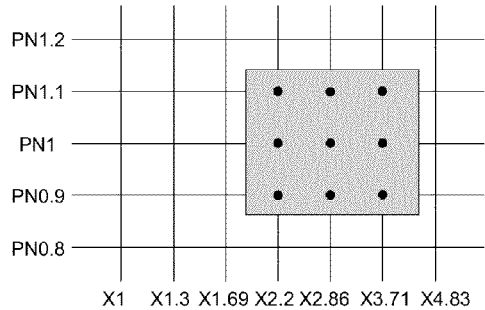
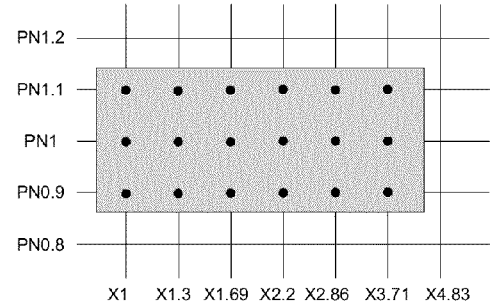
Figure 16A     Figure 16B
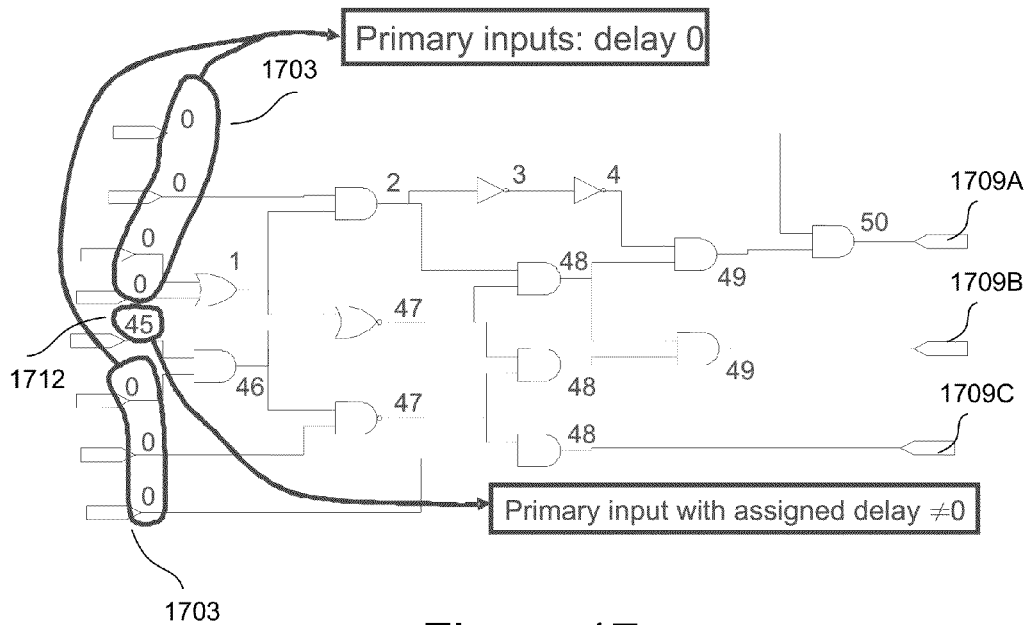
Figure 17

EFFICIENTLY USING CELL LIBRARIES WITH A LARGE NUMBER OF CELLS

CROSS-REFERENCE TO RELATED APPLICATIONS

This patent application claims the benefit of U.S. provisional patent applications 61/493,300 and 61/493,305, filed Jun. 3, 2011, which is incorporated by reference along with all other references cited in this application.

BACKGROUND OF THE INVENTION

This application is related to the design of digital circuits, more specifically circuits whose design relies on the use of cell libraries.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications. Different forms factors for electronics such as tablets and smart phones will require greater performance as well as reduced electric consumption. Higher speed Internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of components including gates and transistors and are very complex. As the process of producing integrated circuitry improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and better performance in integrated circuits.

Therefore, there exists a need for improved techniques for electronic design automation.

BRIEF SUMMARY OF THE INVENTION

Methods improve integrated circuit design by using cell libraries with a large number of cells. Some electronic automatic tools optimize the design of digital circuits (e.g., integrated circuits) based on cell libraries. This means that most design flows of digital circuits will have a step where the digital logic is mapped to an interconnected set of cells from the library.

The cells from the library implement logic primitives (Boolean functions and storage elements) that are then connected to each other to produce the desired functionality for the complete circuit. The step of converting the equations to a set of interconnected cells is done in a way to obey constraints in some costs (e.g., a required frequency) while minimizing other costs (e.g., area or power). This step is normally referred to as technology mapping and is implemented using tools.

The inputs to the tools can be a design, a predesigned library, and the optimization goals. The quality of a cell-based design depends heavily on the quality of the library (or cell library) used for the design. Techniques of the invention provide method of producing better libraries, so that better designs and a more efficient way to perform timing closure can be done.

To improve the design quality of integrated circuits, it is necessary to use larger and larger cell libraries (with a greater quantity of cells). But synthesis and optimization tools are limited in their capability to use large cell libraries. Thus, increasing the size of a cell library often leads to designs with a lower quality. Therefore, methods for creating cell libraries that are efficiently usable by current optimization tools while having a greater quantity of cells are necessary. The use of the cell libraries, possibly by cell attributes, is dependent on the fact that the cell libraries are used divided into subsets.

It is therefore important to tailor the cell library size to the optimization tools in order to get competitive results produced. The invention makes it possible to organize a very large cell library into a set of sublibraries such that optimization tools can utilize the cell library better. In order to improve the design quality of integrated circuits it is necessary to use larger and larger cell libraries.

Advantages of the method over prior art include that the organization of the library is divided into subsets. Notice that the subsets may be formed by filtering attributes associated to the cells. In this regard, the subsets are formed by filtering cells by associated attributes. The stored attributes associated with a cell may be related to structural properties of the cell, or the attributes may reflect the expectations of area, power, or timing (delay reduction) gains the cell is expected to provide. This will allow the complete library to be hidden from the optimization tool as the subsets can be offered to be seen individually during the optimization process. This way, library subsets with specific purposes are offered to the synthesis engine in such a way that the maximum amount of cells (in the library subset) seen by the optimization engine is kept to a manageable size. Techniques of the invention are also useful for generating a library itself, as combined cells can reuse layout and characterization data from cells generated previously.

In an implementation, the subset of the library is organized by: associating attributes to the cells; cells aimed at a specific optimization goal; cells that are skew variants of the cells in the initial library; cells that are skew variants of the cells in the initial library; cells that are alternative transistor topologies of the cells in the initial library; cells that are alternative transistor topologies of the cells in the initial library; cells that are functions of type series-parallel with up to three transistors in series; or cells that are functions of type series-parallel with up to three transistors in series.

In an implementation, the cell library subsets are organized by: complex Boolean functions; combined cells; high-density cell variants; footprint compatible cell variants; distinct files.

In an implementation, a derived library is created by selecting a subset of cells from at least one of the cell subsets from a subsetted library.

In an implementation, preliminary optimizations are done by using different combinations of library subsets. Where the preliminary optimizations are analyzed, a new composed library can be produced by selecting a group of cells from the cell subsets used in the preliminary optimizations. The optimizations can be made using footprint compatible cell subsets used in the backend optimization.

In an implementation, the library is used to map an entire circuit. In another implementation, the library is used to map only a particular region of a circuit being optimized. Not all the subsets in a library may be needed to be used in a mapping. In another implementation, a composed library is produced by selecting a group of cells from the cell subsets used in the preliminary optimizations.

Techniques of the invention are also useful for generating a library itself, as combined cells can reuse layout and characterization data from cells generated previously. The advantage of the invention is to make a cell library with a large number of cells efficiently usable by current synthesis tools.

In an implementation, a method includes: providing a plurality of cells in a cell library; determining at least a first subset of cells of the cells in the cell library based on a first characteristic, where the characteristic comprises a logical functionality; and using at least one processor, using a second characteristic to determine from the first subset at least a second subset of the cells in the cell library.

In various implementations, the second characteristic includes topology variants. The second characteristic includes drive strength variants. The second characteristic includes different internal sizing for cells with same drive strengths.

The method can further include using a third characteristic to determine from the second subset a third subset of the cells in the cell library, where the third characteristic is different from the second characteristic; and inputting to a cell-based synthesis engine the third subset, where the third subset comprises fewer cells than the cells in the cell library.

It is necessary that all the subsets are used in an optimization by a cell-based synthesis engine. This will improve efficiency and the optimization. Distinct preliminary optimizations can done by using different combinations of library subsets, in any combination of the one or more characteristics or variants.

The preliminary optimizations are analyzed, and a new composed library is produced by selecting a group of cells from the cell subsets used in the preliminary optimizations. The composed library can be used to map a circuit. Further, the distinct preliminary optimizations can be applied to different regions of a circuit being optimized. Also, a footprint of compatible cell subsets can be used in the backend optimization. A cell is footprint compatible with another cell if the input/output (I/O) connections of the cells are available at the same relative places at the interior of the cells.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 9A-9C shows different transistor networks topologies for a NAND3 cell.

FIGS. 10A-10B shows two different internal gains for a NAND3 network with same external drive strength.

FIGS. 11A-11B shows two different drive strengths for a NAND3 network derived from the same seed size.

FIGS. 12A-12D shows three different skew variants derived from a reference cell.

FIGS. 16A-16B shows filtering cells by drive strength and skew variant range.

FIG. 17 shows a circuit and its forward delays from inputs to outputs.

DETAILED DESCRIPTION OF THE INVENTION

U.S. patent application Ser. No. 12/479,603, filed Jun. 5, 2009, and entitled "Library Sizing;" and Ser. No. 12/479,766, filed Jun. 6, 2009, and entitled "Library Enrichment" are incorporated by reference along with all other references cited in this application.

Figure 1:
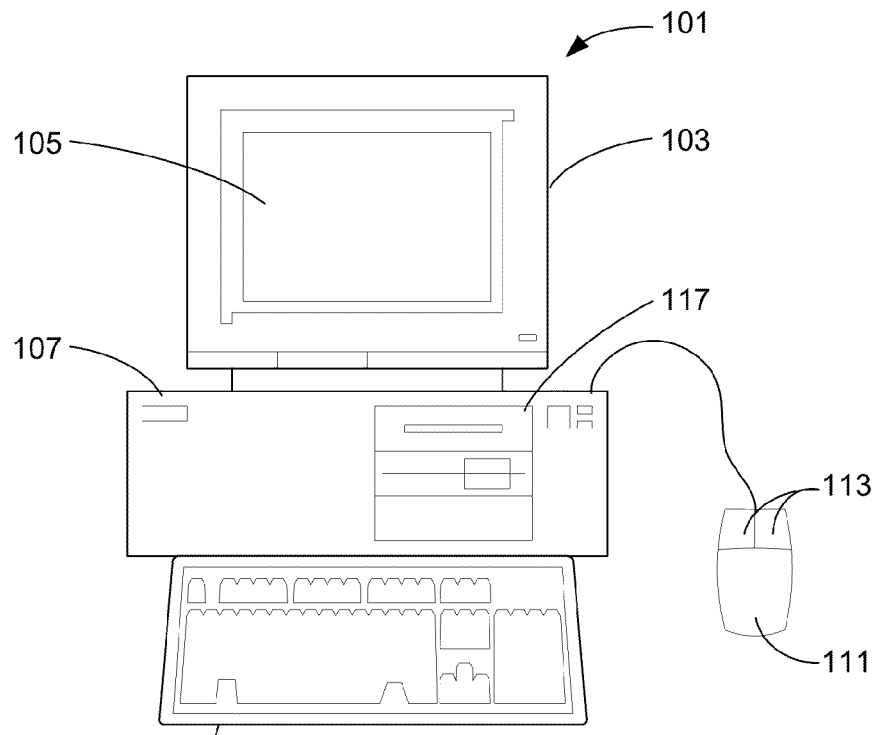
FIG. 1 shows a system of the present invention for performing electronic design automation.

FIG. 1 shows a system of the present invention. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor (including the possibility of a multiprocessor and gridding), memory, mass storage devices 17, and the like.

Mass storage devices 17 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented or computer-executable version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 17. The source code of the software of the present invention may also be stored or reside on mass storage device 17 (e.g., hard disk, magnetic disk, tape, or CD-ROM). As a further example, code of the invention may be transmitted via wires, radio waves, or through a network such as the Internet.

Figure 2:
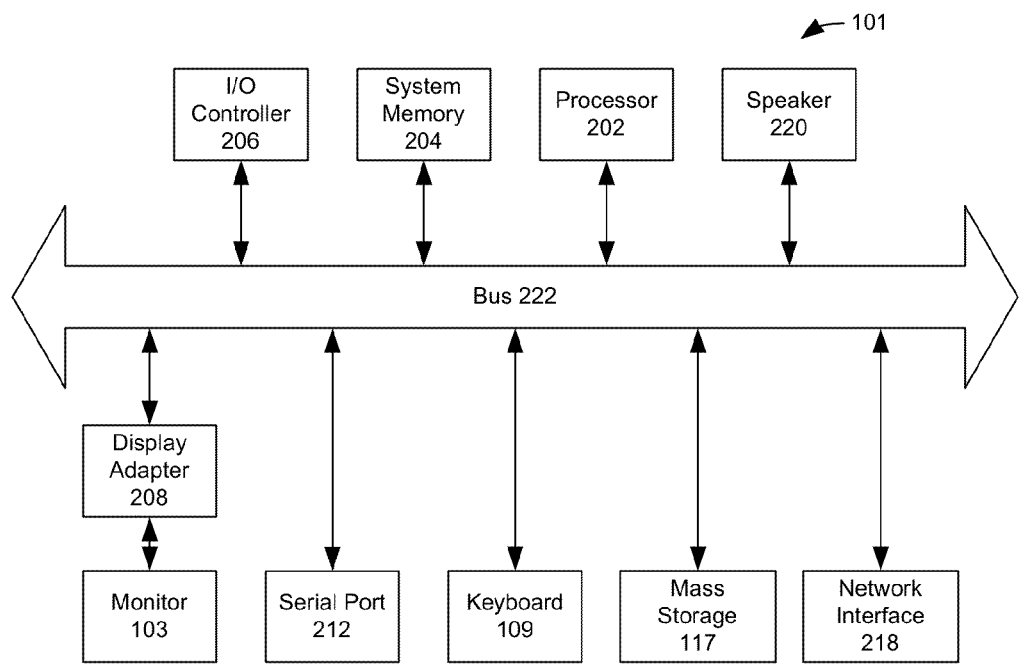
FIG. 2 shows a simplified system block diagram of a computer system used to execute software of the invention.

FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal Ethernet network, Internet, or other network.

Arrows such as 222 represent the system bus architecture of computer system 1. However, these arrows are illustrative of any interconnection scheme serving to link the subsystems. For example, speaker 220 could be connected to the other subsystems through a port or have an internal connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, Matlab (from MathWorks, Inc.), SAS, SPSS, Java, JavaScript, TCL, and AJAX. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows 8, Windows CE, Windows Mobile), Linux, HP-UX, UNIX, Sun OS, Solaris, Mac OS X, iOS, Android, Alpha OS, AIX, IRIX32, or IRIX64, or combinations of these. Microsoft Windows is a trademark of Microsoft Corporation. Other operating systems may be used. A computer in a distributed computing environment may use a different operating system from other computers.

Furthermore, the computer may be connected to a network and may interface to other computers using this network. For example, each computer in the network may perform part of the task of the many series of steps of the invention in parallel. Furthermore, the network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, 802.11n, and 802.1 lac, just to name a few examples), near field communication (NFC), radio-frequency identification (RFID), mobile or cellular wireless (e.g., 2G, 3G, 4G, 3GPP LTE, WiMAX, LTE, Flash-OFDM, HIPERMAN, iBurst, EDGE Evolution, UMTS, UMTS-TDD, 1xRDD, and EV-DO). For example, signals from a computer may be transferred, at least in part, wirelessly to components or other computers.

Figure 3:
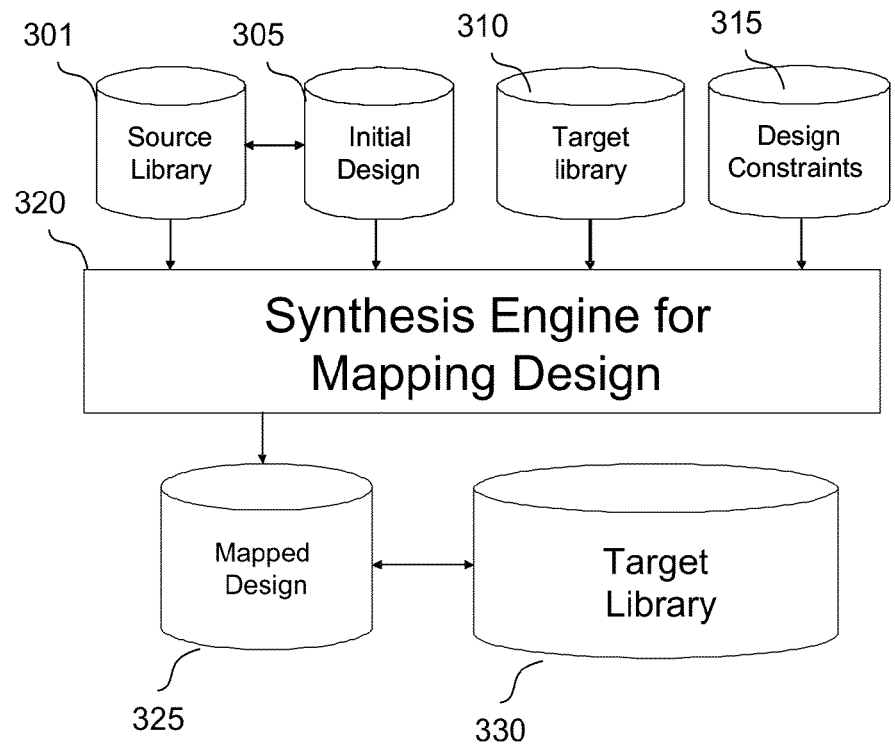
FIG. 3 shows a synthesis engine for mapping a design, including associated data to the process.

FIG. 3 shows a synthesis engine for mapping a design. The synthesis engine includes a source library 301, an initial design 305, a target library 310, and a set of design constraints or optimization goals 315. The process includes the movement of the associated data through the synthesis engine for mapping design 320, which produces a mapped design 325 and further a target library 330. These concepts, together with the presented references, clearly show the scope and background of the invention.

An advantage of the method is that is provides an automatic way to generate a library that covers a continuous spectrum for a wide variety of cell variants. This way, users can obtain a cell library that has the full potential to provide the support for high performance integrated circuit design.

Cell-based design (such as cell libraries) can be configured to account for various factors, such as mapped/unmapped designs, source library, optimization goals, design constraints, target library, available logic functions, synthesis engine, cell drive strength, drive strength distribution, cell P/N ratio and skew variants, cell topology variants, cell buffer variants, cell folding variants, multistage cells, and stage gain on multistage cells. These concepts are briefly discussed below.

Mapped/Unmapped Design.

A design is said to be mapped when it is expressed as a network of interconnected cells from a library. Each cell in the library may be instantiated many times; some may be less instantiated (even just once) and some cells available in the library may not be used at all. A design is said to be unmapped when it is described at a higher level, without making references (instantiations) of cells from a library as subdesigns. The task of minimizing design costs while converting an unmapped design into a mapped design is normally called technology mapping. Similarly, the term remapping is used for the conversion of a mapped design into a different mapped design; the term technology independent optimization is used for the conversion of an unmapped design into a different unmapped design; and the term unmapping is used for the conversion of a mapped design into an unmapped design.

Source Library.

When the initial design is a mapped design, it is associated to a library (by definition a mapped design is associated to one or more libraries). The libraries to which the initial design is associated to is referred as the source library or the source libraries. The library can be divided into multiple files, or grouped into a single file that either contain the cells or includes the other files. In the following, the term library should be interpreted as single or multiple files and consider as the library can be divided into multiple files, or grouped into a single file that either contain the cells or includes the other library files.

Optimization Goals and Design Constraints.

Optimization goals and design constraints describe to the optimization tool what are the requirements of the designer for the particular design being treated. Typically the optimization tool receives a mix of optimization goals and design constraints, which can be expressed for various points of the circuit. Examples include: minimize area and power while respecting desired arrival times and frequencies; reduce timing and respect maximum area; respect maximum area and increase yield. Many other combinations of design goals and constraints can be used by designers to achieve their goals; the ones cited here have the goal of exemplifying and do not limit the scope of the invention.

Target Library.

For any optimization step that produces a mapped design, which will refer to a library, it is necessary to specify the target library, containing the cells that can be used by the mapping tool. It is possible for mapping tools to deal with more than one target library, as the available cells can be divided into different libraries.

Available Logic Functions.

Each library has a number of available logic functions that can be implemented as a single cell from the library. Notice that functions that are not directly available in the library as a single cell can be implemented as an interconnection of several cell instances (indeed, a knowledgeable person will recognize that any combinational logic function can be implemented by using multiple instances of a NAND2 cell). Depending on who designed the library, the choice of the available logic functions can include more or less logic functions. This can very from just a few functions to more than a thousand different cells, for different experiments reported in the literature.

Synthesis Engine for Mapping Design.

A synthesis engine for mapping designs is a software tool to produce a mapped design, where some constraints are respected (like required frequency or maximum area) and some design costs (area or power consumptions) are reduced. The synthesis engine takes an initial design, a source library, a target library and a set of design constraints/optimization goals, as shown in FIG. 3. The synthesis engine can be used in incremental mode for faster turnaround, if this option is available in the synthesis engine. One knowledgeable in the art will appreciate that in incremental design mode, the tool is not able to modify the complete structure of the design, but only to apply local changes that have faster turnaround. The output of the synthesis engine is a mapped design that refers to (e.g., instantiates) cells from the target libraries. The initial design can be an unmapped design; in this case the source library is not necessary. The source library and the target library may be the same libraries.

Cell Drive Strength.

Figure 4:
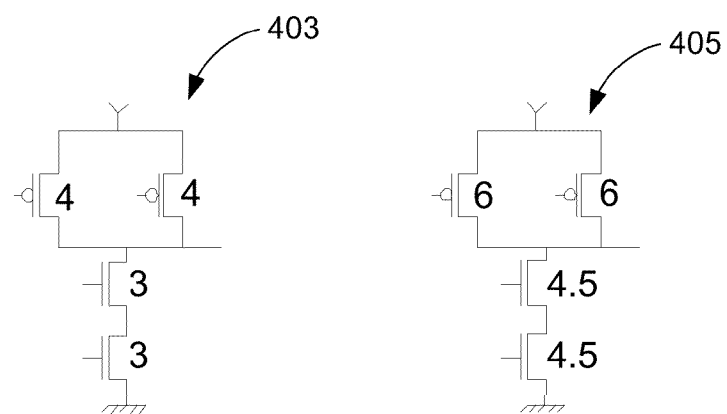
FIG. 4 shows two different drive strengths for a 2-input NAND cell.

The drive strength of a cell is a relative measure of the output charge (capacitance) it can drive, or a measure of the current the cell can deliver to the output load. The drive strength variants of a given cell are versions of a given cell with same transistor network topologies and same (or roughly the same) relative proportion among transistors, but with different transistor sizes so that the cells are aimed to have different abilities to deliver current at the output. This way, different drive strengths are viewed as options to drive different output capacitances. As an example, two different drive strengths for a 2-input NAND cell (e.g. NAND cells 403 and 405) are shown in FIG. 4.

Drive Strength Distribution.

The distribution of drive strengths is an important factor for the quality of a library. It is well known that it is important for timing closure to have a continuous or nearly continuous spectrum of library cells. One characteristic which is very important is the maximum gap in the drive strength distribution. The distribution of drive strengths may be any kind of distribution, but is normally a geometric distribution.

Cell P/N Ratio and Skew Variants.

Figure 5:
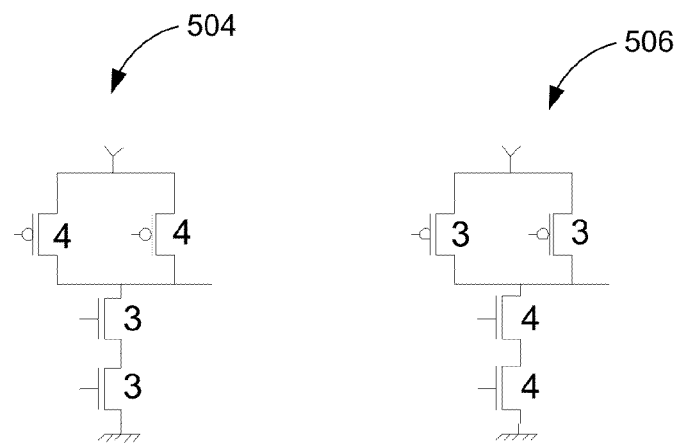
FIG. 5 shows two different skew variants for a 2-input NAND cell.

The skew variants are versions of a given cell with same transistor networks topology and same (or roughly the same) relative proportion among transistors of the same type, but different ratios between PMOS and NMOS. Normally skew variants offer cells with different P/N ratios but same (or roughly the same) input capacitance. This way, different skew variants are used to balance effects of asymmetric transitions, especially on critical paths. As an example, two different skew variants for a 2-input NAND cell (e.g. NAND cells 504 and 506) are shown in FIG. 5.

Cell Topology Variants.

Figure 6:
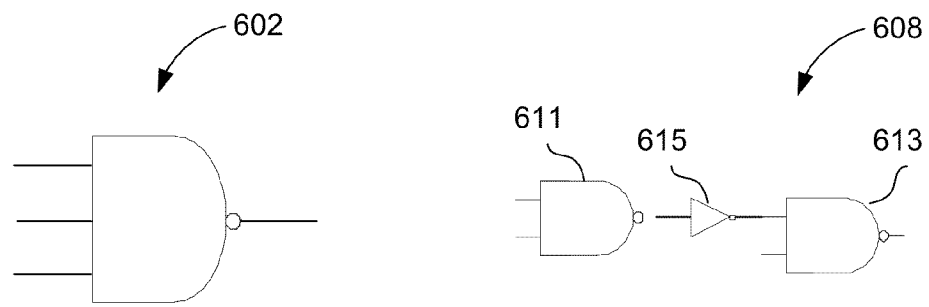
FIG. 6 shows two different topology variants for a 3-input NAND cell.

The topology variants are versions of a same cell such that the interconnection of transistors is different (or nonisomorphic). This can include internally dividing a cell stage into more than one stage or vice versa; change the order of serially connected transistor networks, or any other method to derive a nonisomorphic transistor network that performs the same logic function. As an example consider the two topologies for a 3-input NAND cell (e.g. NAND cells 602 and 603) shown in FIG. 6. A knowledgeable person can identify that the single stage topology is meant to be a single stage composed of six transistors while the three stage topology has ten transistors (four transistors for each of 2-input NAND cell (e.g. NAND cells 611 and 613 and two transistors for the inverter 615).

Cell Buffer Variants.

Cell buffer variants are topology variants of a cell obtained by internally buffering the output.

Cell Folding Variants.

Cell folding variants are topology variants of a cell that basically divide large transistors into an equivalent number of smaller transistors connected in parallel. The basic reason to perform folding is to adapt the transistor topology of the cell to the desired cell template. A given cell template normally has a maximum transistor size it can accommodate. This way, transistors larger than the maximum supported by the target library template have to be divided into smaller transistors connected in parallel.

Multistage Cells.

Multistage cells are cells which are composed of more than one static CMOS complex gate. Multistage cells can happen for at least three different reasons. First, the use of internal buffering implies multistage cells. This is the case of a 2-input NAND cell with a 2-stage internal buffer at the output. Second, multistage cells are used to limit the number of series transistors. This is the case of a 6-input NAND cell, which cannot be implemented as a single stage cell as the use of six transistors in series is not efficient due to electrical reasons (in this case, a multistage cell is a faster cell). Third, multistage cells can happen due to the nature of the logic function implemented in the cell. This is the case of any cell having binate or positive unate inputs. For instance a 2-input and cell is normally implemented with two stages: a 2-input NAND followed by an inverter.

Stage Gain on Multistage Cells.

In the case of multistage cells, intermediate stages will be driving other intermediate stages or the output stage. The drive strengths of different stages will in most cases be distinct for each of the stages. The ratio of drive strengths between successive stages defines the gain of internal (non-output) stages. This is an important parameter for multistage cells.

Combined Cells.

Figure 7A:
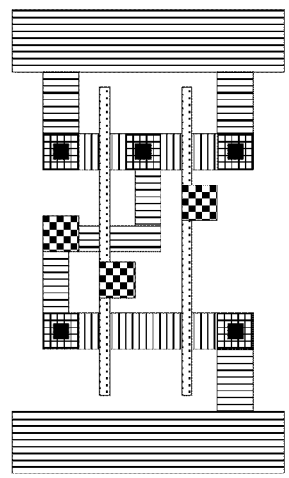
FIGS. 7A-7C show a combined cell obtained from a NAND2 driving one input of a nor2.
Figure 7B:
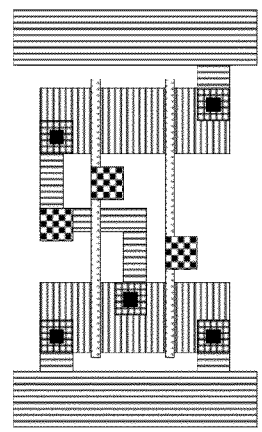
Figure 7C:
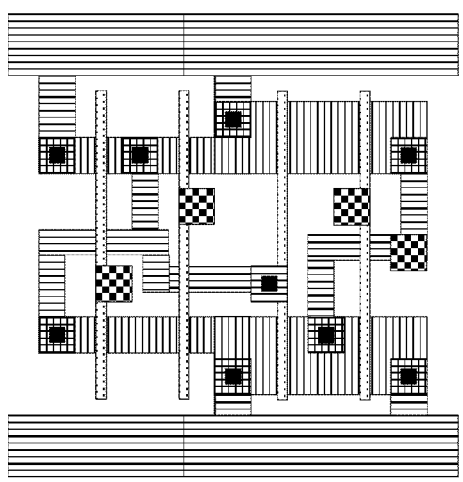

A combined cell is a cell that is obtained through the combination of two cells present in the library into a single cell that is made available in the libraries. A simple example of that is a cell with the output driving an input of the other cell. Typically, combined cells have multistage implementations, even if this is not a requirement. In a more general view, mixing single stage transistor networks (or corresponding equations) by connecting the output of one stage to the input of the other could be a way to obtain combined cells, even if the transistor networks (or corresponding equations) are not initially present in the library. FIGS. 7A-7C illustrate a combined cell obtained from a NAND2 driving one input of a nor2. FIG. 7A shows a NAND2 cell. FIG. 7B shows a nor2 cell. FIG. 7C shows a combined cell composed of a NAND2 driving a nor2.

A person knowledgeable in the art would appreciate that in this case, the area of the combined cell is reduced with respect to the sum of the areas of the original cells.

High-Density Cells.

A high-density cell is a cell that is primarily targeted for area optimizations those cells may have different cell templates (yet still compatible with the library cell template) targeted for area optimization. One special case of these cells are cells with double (or multiple) rows of PMOS and NMOS transistors, instead of a single row of PMOS transistors and a single row of NMOS transistors.

Library Template.

As the final layout of the complete design is done by placing cells side by side, the design of the cells is restricted so that they will fit together more easily when placed this way. Vendors can provide libraries with different templates to accommodate different design goals, like power consumption or high speed. It is not uncommon for a vendor to provide at least three different standard cell libraries for the same technology node: general purpose, high speed and low power versions of the libraries. These libraries will use different templates and have different row heights and power grid sizes. This way, designers can choose among the three different versions of the library to accommodate their designs. Some examples of library templates are discussed in (Lefebvre, DAC, 1997), with the name of cell architecture; and they are also discussed in U.S. Pat. No. 6,539,533 with the name of cell constraints file or cell overall plan, which are incorporated by reference.

Double-Height Cells.

Normally a cell is designed to fit into a row of cells, by following the parameters defined in the library template. It is possible to have cells that will fit into two adjacent rows of cells. These cells are referred as double-height cells as they occupy space in two adjacent rows of cells and the height of the cell is doubled or nearly doubled to fit the cell in both rows. Cells that require more routing or more space to size transistors can be designed as double-height cells. Cells using more than two rows of height are referred as multiple height cells.

Drive Strength, Size, and Area.

The drive strength of a cell is related to the ability of a cell to provide current to charge or discharge an output node. For multistage cells, the drive strength depends mainly on the last stage of the cell. The "size" of the cell can be measured with different meanings: input capacitance of the cell, sum of transistor sizes (widths) or final area after layout; the word size then depend on context. In this sense, the area of a particular drive strength cell tends to be roughly proportional to the drive strength, for cells having the same topology; but this is just a tendency. This is not the case for drive strengths with different topologies, as an example consider a multistage cell topology with an output buffer, which is smaller than the nonbuffered version for high drive strengths, and larger than the non buffered version for smaller drive strengths. Note that after obtaining a sized transistor network for a particular cell, it may need folding when performing the final layout of the cell and adapting it to a particular library template, which also can make the relation between drive strength and area slightly different from what one would expect a priori.

Footprint Compatible Cells.

Figure 8A:
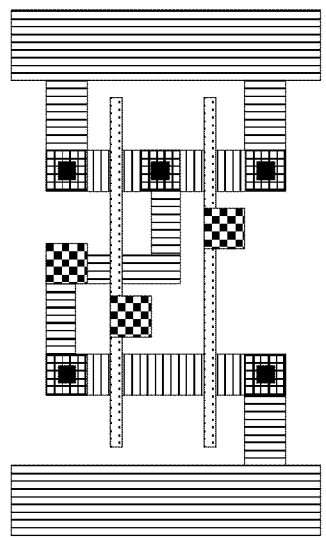
FIGS. 8A-8C shows footprint compatible and incompatible cells.
Figure 8B:
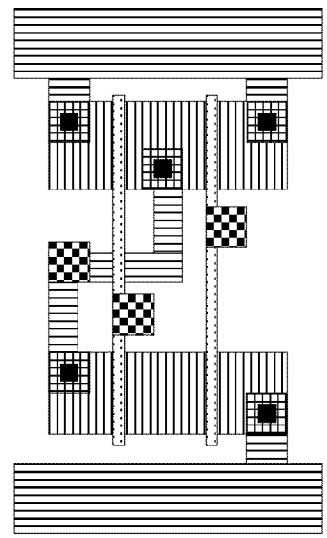
Figure 8C:
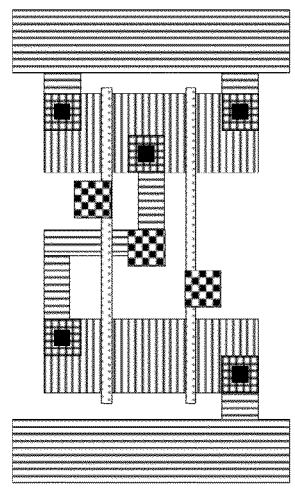

A cell is said to be footprint compatible with another cell if the input/output (I/O) connections of the cells are available at the same relative places at the interior of the cells. This is an especially important feature at the backend of the design flow, as it allows exchanging one cell by another cell without affecting the detailed routing. This way, it is possible to use footprint compatible drive strengths and skew variants very late in the design flow to perform sizing of the circuit to better optimize the design power and delay characteristics while respecting the requirements imposed by design constraints. The fact of performing these optimizations late in the design flow allows fine-tuning the power/delay characteristics of the design in accordance to the requirements specified by the design constraints. FIGS. 8A-8C present a NAND2 X1 reference cell (FIG. 8A) and two NAND2 X2 cells. The NAND2 X2 cell of FIG. 8B is footprint compatible with the reference X1 cell (of FIG. 8A). The NAND2 X2 cell of FIG. 8C is footprint incompatible with the reference X1 cell (of FIG. 8A).

Some implementations of using a cell library of circuit design are discussed below:

Optimization of Design and Library.

This presents a method for making a simultaneous optimization of a design and a library.

Optimization by Expansions and Contractions.

This presents a method to perform circuit optimizations by expansions and contractions of the design space. It can do it by either adding/removing cells from the library or by modifying artificially the design constraints.

Library Sizing.

This presents a method for library sizing, presenting ways to create drive strength and skew variants for cells. It allows the creation of a large cell library, with many implementation options for each cell function.

Library Enrichment.

This presents a method for library enrichment, by creating a larger cell library by adding additional implementation options for the cells already existing in the library. The creation of the new options take into account the existing cells, in order to perform a more efficient enrichment of the library.

Cell Uniquification.

This describes how to uniquify cell instances with similar electrical characteristics (drive strength, skew variant) and identical functionality.

These implementations do not present the concept of organizing the library into library subsets to allow better use for current synthesis tools. This way, when these implementations create a large library this may result in a library that is not efficiently usable by current design tools, as synthesis and optimization tools are limited in their capability to use large cell libraries. In fact, it has also been shown many times that increasing the size of the cell library will often lead to designs having a lower quality. Therefore, methods for creating cell libraries that are efficiently usable by current optimization tools while having a large quantity of cells are necessary.

Techniques of the invention offer ways to organize or divide a cell library with a large amount of cells into meaningful subsets, according to expected gains or influence in the synthesis process. The techniques are also useful for generating a library itself, as combined cells can reuse layout and characterization data from cells generated previously. In the process of generating the library, the similarities among cells of the same subset can also be exploited, making the generation of the library easier.

The basis of organizing or dividing a library into subsets is to index cells by functionality and then generate alternative implementations for each cell functionality. These alternative implementations consider different topology variants, different drive strength variants, different skew variants and different internal sizing for cells with same drive strengths.

FIGS. 9A-9C present three different transistor topologies for a NAND3 cell. The topology presented in FIG. 9A is a straightforward single stage NAND3. FIG. 9B shows a 3-stage topology, decomposed into NAND2 and intermediate inverter. FIG. 9C shows a 3-stage version of the cell with output buffer.

FIGS. 10A-10B present two different internal gains for a NAND3 network with same external drive strength. The external drive strength is given by the sizes of the output buffer. The output buffer has identical sizes for FIGS. 10a and 10b. The identical sizes are Wp=32 and Wn=24 as represented in the figures. 108a presents a cell with internal gain equal to 4, while FIG. 10B presents a cell with internal gain of 2.5.

FIGS. 11A-11B present two different drive strengths for a NAND3 network derived from the same seed size. FIG. 11A presents a cell with drive strength X1, while FIG. 11B presents a cell with drive strength X3. Notice that all the transistor sizes are multiplied by three when passing from the X1 version 1106 to the X3 version 1109. This is the case in this particular example.

FIGS. 12A-12D present three different skew variants derived from a reference cell. One important characteristic of these cells is that the input capacitance is approximately the same for all the cells; for example, the sum of the sizes of a P and a N transistor for each cell is the same and equals to 31.7. This way, for the reference cell (in FIG. 12A) 15.2+16.5=31.7, for the second cell (in FIG. 12B) 15.7+16=31.7, for the third cell (in FIG. 12C) 14.7+17=31.7 and for the fourth cell (in FIG. 12D) 17.3+14.4=31.7. The P/N ratios vary as the proportion between P and N sizes vary. However, the sum of P and N values remain roughly constant. Notice that for older technology nodes the constant sum of P and N values would guarantee a constant input capacitance for the cell. For more advanced technology nodes, this capacitance would be approximately constant and it should be determined through a cell characterization engine, which will provide the exact value for the capacitance. A person knowledgeable in the art will appreciate that to vary the P/N ratio by a given scale factor, the transistor sizes have to be divided or multiplied by $\sqrt{\text{ScaleFactor}}$ (i.e., the square root of the scale factor).

A combined cell is a cell that is obtained through the combination of two cells present in the library into a single cell that is made available in the library. A simple example of that is a cell with the output driving an input of the other cell. Typically, combined cells have multistage implementations, even if this is not a requirement. Combined cells may be a different way to obtain new cell variants from already existing cells in the library. In a more general view, mixing single stage transistor networks (or corresponding equations) by connecting the output of one stage to the input of the other could be a way to obtain combined cells, even if the transistor networks (or corresponding equations) are not initially present in the library.

Techniques of the invention described herein are based on organizing a cell library into subsets by filtering cells according to certain characteristics. Then subsets of cells representing library subsets can be obtained to allow the synthesis engine to look into specific subsets of the library. Basically, subsets of the library are obtained by filtering cells according to library specification subsets. In order to better understand the concept of a library specification subset, first the characteristics used to filter the cells in the library are presented. Some sample characteristics of cells are provided following:

Function ID: Function IDs or identifications can be used to filter the library. It is convenient to group cells in the large library by function ID, so that the filtering occurs by function ID. The function ID is a unique identification tag (e.g., a number, a string) that identifies the logic functionality that is implemented by the cell.

Function characteristics: Read-once, positive or negative unate, binate inputs, number of series transistors allowed, number of parallel transistors allowed. These characteristics can be used to filter the set of function IDs in a library. For instance, one knowledgeable in the art would appreciate that the library 44-6.genlib, distributed with SIS, is the set of all read-once equations, with negative unate polarity having a maximum of four series transistors when implemented with a single CMOS series/parallel gate.

Range of number of inputs: the range of number of inputs allowed for a cell. A cell library can also be filtered by number of inputs.

Range of number of outputs: the range of number of outputs allowed for a cell. A cell library can also be filtered by number of outputs.

Topology: number of stages, single stage, multiple stage, single stage plus buffer (inverting or non-inverting), cells with favored input, cells with simple last stage, combined cells.

Drive strength range: The range of drive strengths intended for the cells, including granularity (meaning the number of intermediate drive strengths and the step (or the ratio) between successive drive strengths in the distribution, related to the ratio of the distribution).

Skew variant range: The range of skew variants intended for the cell including granularity (meaning the number of intermediate skew variants and the step (or the ratio) between successive skew variants in the distribution, related to the ratio of the distribution).

This way, the creation of a library typically starts from a list of candidate function IDs that are considered good candidate functions to become cells for optimization of a specific circuit. The list of candidate IDs may come from different sources. For the purpose of exemplifying, and not as a limitation, the method we list three different ways of obtaining a list of candidate IDs.

First, it could be derived from a set of functions defined implicitly through structural constraints. For instance, a person knowledgeable in the art will understand that the set of all single stage CMOS series-parallel logic gates with no more than four series transistors in the pull-up and pull-down of the cells will define a set of 3503 unique function IDs. From this group, an additional set of 3503 unique function IDs could be generated by inverting the logic functions, leading to a set of 7006 unique function IDs. If a matrix of three drive strengths by three skew variants is generated for each function ID, then there are nine cell versions for each function ID, leading to a total of 63,054 different cells in the library. This huge number of cells, not manageable by a cell based synthesis engine, is referred as a megalibrary.

Figure 13:
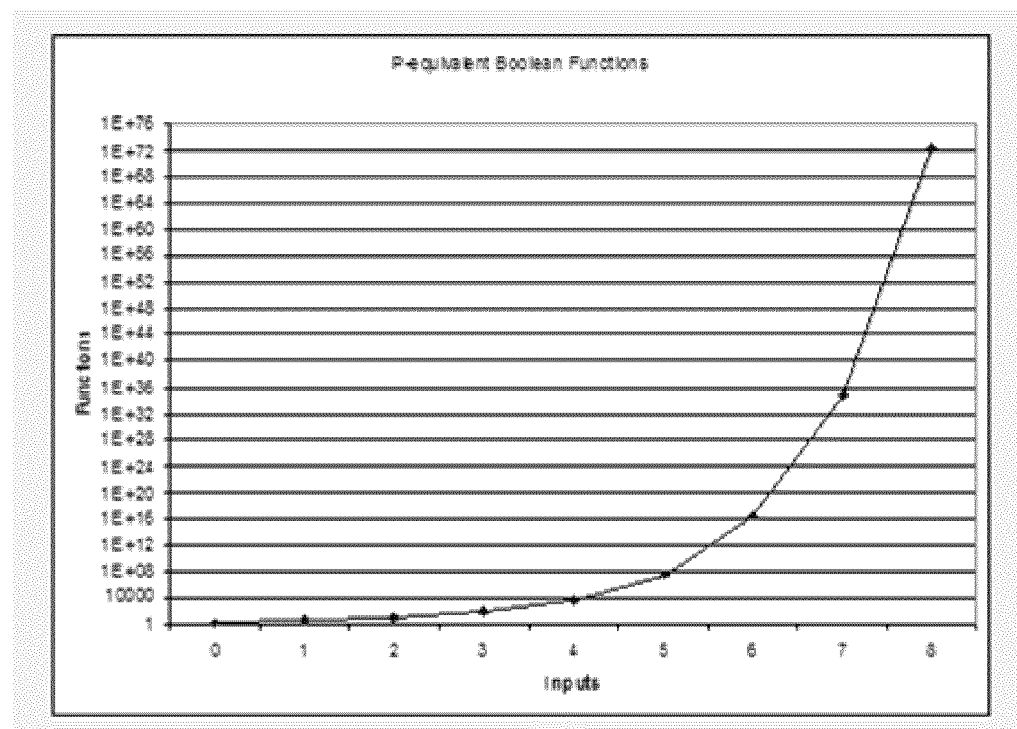
FIG. 13 shows number of different permutation classes of functions with n-inputs.
Figure 14A:
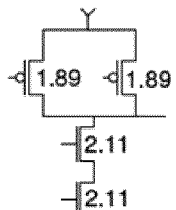
FIGS. 14A-14F shows six cell distribution illustrating drive strengths and P/N ratios.
Figure 14B:
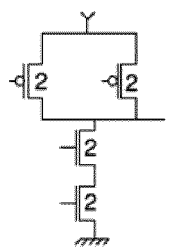
Figure 14C:
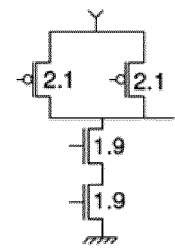
Figure 14D:
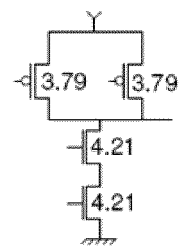
Figure 14E:
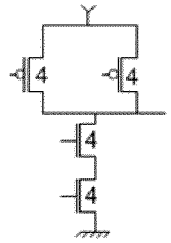
Figure 14F:
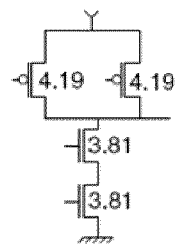

A second way to implicitly define a set of function IDs is by addressing all the possible functions up to a given number of inputs. A person knowledgeable in the art will understand that there are 65,536 different 4-input logic functions, but as many of them are equivalent under input permutation (P-equivalence) only 3984 unique IDs are relevant to implement a library. In fact, by removing contant-0 and constant-1 functions, only 3982 unique IDs are necessary, if constant-0 and constant-1 are not needed in the library. In this group of 3982 function IDs, inverting a logic function will generate a function ID whose P-equivalent is already present in the set. If a matrix of three drive strengths by three skew variants is generated for each function ID, then there are nine cell versions for function ID, leading to a total of 35,838 different cells in the library. Notice that this number was originated from the 3984 different function IDs representing the 4-input P class. FIG. 13 shows the number of different P-equivalent groups up to 8-inputs. Notice that the growth is exponential, leading to a huge number of cells, not manageable by a cell based synthesis engine, and referred as a megalibrary.

A third way to define a set of function IDs is to look into an available library and look for possible ways to combine cells available in the library. If 400 cells are available in the library then a number higher than 160,000 (e.g., 400^2, 400^3) cells can be obtained. Please notice that not all combinations are meaningful, but more combinations can be obtained considering that many cells have multiple inputs. Also, more than two cells could be combined resulting in an even larger of cells. Again, a huge number of cells, not manageable by a cell-based synthesis engine, is obtained and referred as a megalibrary.

As these huge cell libraries are not directly manageable or efficiently used by synthesis engines, it is important to have means to let the synthesis engine to look into subsets of the cell library as opposed to look into the complete library. The subsetting of the library could be done by defining the topological characteristics that would be allowed for the cells in the library. This way, if a subset is defined to have cells with two or three PMOS transistors in series and three or four NMOS transistors in series, a subset of 10+58+23+285=376 function IDs is obtained. Similarly, if a subset is defined to have cells with 2 or 3 PMOS transistors in series and two or three NMOS transistors in series, a subset of 4+10+10+58=82 function IDs is obtained. As an example, consider table I, which presents the number of single stage series parallel CMOS gates considering the number of PMOS and NMOS transistors in series.

TABLE I

Number of single stage series parallel CMOS gates considering the number of PMOS and NMOS transistors in series.

| | | Number of Series PMOS Transistors | | | | |
|---|---|---|---|---|---|---|
| | | 1 | 2 | 3 | 4 | 5 |
| Number | 1 | 1 | 1 | 1 | 1 | 1 |
| of | 2 | 1 | 4 | 10 | 23 | 47 |
| series | 3 | 1 | 10 | 58 | 285 | 1233 |
| NMOS | 4 | 1 | 23 | 285 | 2798 | 23,651 |
| Transistors | 5 | 1 | 47 | 1233 | 23,651 | 372,436 |

Another way of doing the subsetting is by choosing the allowed number of inputs of single-stage series parallel CMOS gates with a maximum of p PMOS transistors in series and a maximum of n NMOS transistors in series, classified according to the number of inputs of the gate. If a maximum of three (series PMOS) by four (series NMOS) is allowed, and the range of inputs of the cell is limited to six to eight, a subset of 37+58+79=174 unique function IDs is obtained. If a maximum of four (series PMOS) by four (series NMOS) is allowed, and the range of inputs of the cell is limited to seven to ten, a subset of 116+228+374+530=1248 unique function IDs is obtained. As an example, consider table II.

TABLE II

Number of single stage series parallel CMOS gates with a maximum p PMOS transistors in series and a maximum of n NMOS transistors in series, classified according to the number of inputs of the gate. Notation for columns is p by n.

| # inputs | Maximum 2 by 2 | Maximum 3 by 3 | Maximum 3 by 4 | Maximum 4 by 4 |
|---|---|---|---|---|
| 1 | 1 | 1 | 1 | 1 |
| 2 | 2 | 2 | 2 | 2 |
| 3 | 2 | 4 | 4 | 4 |
| 4 | 2 | 8 | 9 | 10 |
| 5 | — | 14 | 18 | 22 |
| 6 | — | 20 | 37 | 54 |
| 7 | — | 20 | 58 | 116 |
| 8 | — | 12 | 79 | 28 |
| 9 | — | 6 | 79 | 374 |
| 10 | — | — | 63 | 530 |
| 11 | — | — | 32 | 612 |
| 12 | — | — | 14 | 604 |
| 13 | — | — | — | 468 |
| 14 | — | — | — | 300 |
| 15 | — | — | — | 130 |
| 16 | — | — | — | 48 |
| Total | 7 | 87 | 396 | 3503 |

Notice that for each of these function IDs, drive strength and skew variants, as well as topology variants can be created. Typically, each topology variant may have a matrix of drive strength and skew variants distribution, as shown in FIGS. 14A-14F and 15A-15C. A person knowledgeable in the art will appreciate that the range and the granularity of the distributions can vary.

Figure 15A:
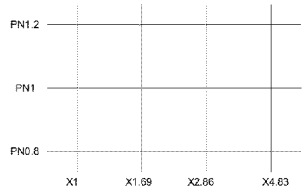
FIGS. 15A-15C shows three different size distributions derived from a given seed cell.
Figure 15C:
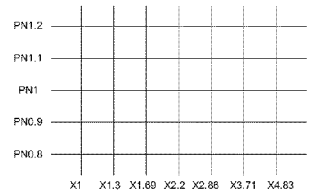
Figure 15B:
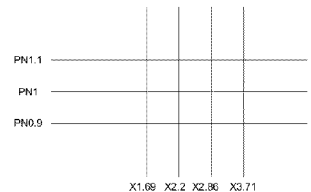

FIG. 15A shows a sparse distribution with 12 cells. FIG. 15B shows a narrow distribution with 12 cells. FIG. 15C shows a 37 cell distribution. The distribution of drive strengths and skew variants presented in FIGS. 14A-14F and 15A-15C can be filtered by range of drive strength and skew variants. This concept is shown in FIGS. 16A-16B. FIG. 16A shows a filtering such that the drive strength ranges from X2.2 to X3.71, while FIG. 16B shows a filtering such that the drive strength ranges from X1 to X3.71. The range of skew variants for FIGS. 16A and 16B is the same; it has been filtered such that the P/N ratios (or skew variants) vary from PN0.9 to PN1.1. For the filtering in FIG. 16A, 9 cells in the enclosing rectangle are selected; for the filtering in FIG. 16B, 18 cells in the enclosing rectangle are selected. A person knowledgeable in the art will appreciate that the filtering of the distribution can be done by range and by the granularity of the distributions. For example the distribution in FIG. 15A can be viewed as a filtering of the distribution in FIG. 15C.

Techniques of the invention described herein consists in using properties of cells to provide a library divided into subsets. This can be achieved by using explicit sets of cells in different files. Or by applying filtering on existing files, based on properties of the cells, such as function ID, function properties, topology variants. In this sense, subsets do not need to be stored in different files, but instead the attributes of each cell (used for filtering) can be associated to the cells to allow efficient filtering. This way, a cell may have structural attributes described before, or it also may have "expectations of use" attributes that describes when a cell is expected to introduce area, power, or timing (delay reduction) gains. Other types of attributes are related to the moment where cells introduce gains at the design flow. Some subsets are useful at the front-end, while other subsets are useful at the backend of the design flow.

Circuit optimization depends on circuit context. A small example of this is given in FIG. 17, which shows forward delays from inputs 1703 to outputs 1709A-1709C when one of the outputs has an arrival time of 45 (1712). One knowledgeable of the art would appreciate that the delays shown in FIG. 17 are forward delays from inputs to outputs. For simplicity, gate delays are considered to have unit delays. One knowledgeable in the art would appreciate that other delay models could be used, possibly depending on output loads and signal slopes. One of the outputs 1709A has forward delay equal to 50, a second output 1709B has delay equal to 49 and a third output 1709C has delay equal to 48. Delays on intermediate nodes of the circuit are also shown. These delays can be obtained with a timing analysis tool like Primetime from Synopsys, which is able to annotate all the values of delays in intermediate nodes. Primetime was cited only for exemplification, other timing analysis tools could be used instead to do the same annotation. Primetime is a trademark of Synopsys Inc.

Figure 18:
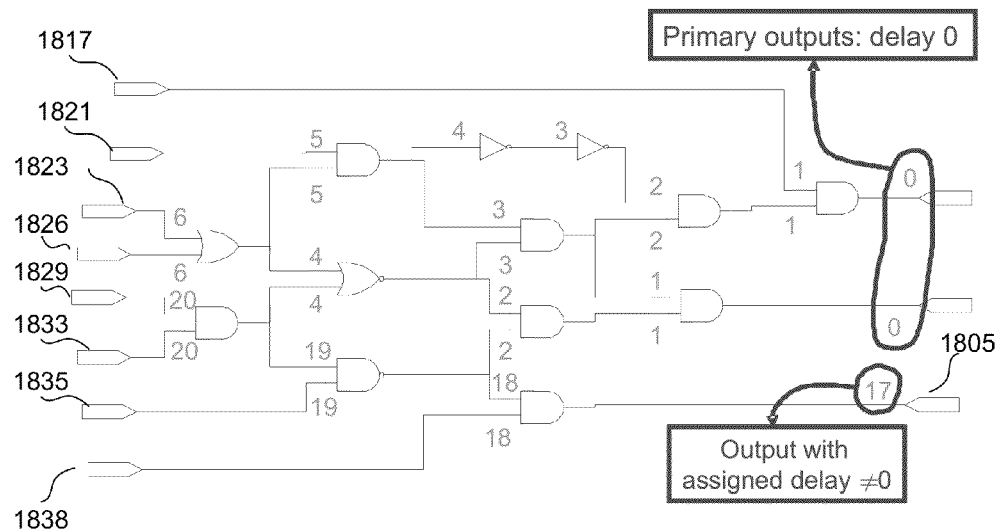
FIG. 18 shows a circuit and its backward delays from outputs to inputs.

Circuit optimization depends on circuit context. A small example of this is given in FIG. 18, which shows backward delays from outputs to inputs when one of the outputs (1805) has a delay time of 17. One knowledgeable of the art would appreciate that the delays shown in FIG. 18 are backward delays from outputs to inputs. For simplicity, gate delays are considered to have unit delays. One knowledgeable in the art would appreciate that other delay models could be used, possibly depending on output loads and signal slopes. One of the inputs 1817 has backward delay equal to 1, a second input 1821 has delay equal to 5, third (1823) and fourth (1826) outputs have delay equal to 6, fifth (1829) and sixth (1833) inputs have delay equal to 20, a seventh input 1835 has delay equal to 19, and an eighth input 1838 has delay equal to 18. Backward delays on intermediate nodes of the circuit are also shown. These delays can be obtained with a timing analysis tool like Primetime from Synopsys, which is able to annotate all the values of backward delays in intermediate nodes. Prime time was cited only for exemplification, other timing analysis tools could be used instead to do the same annotation.

Figure 19:
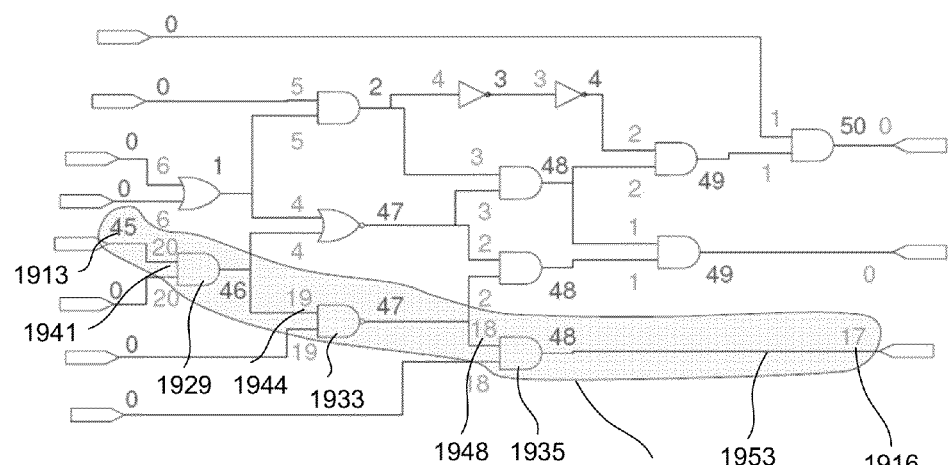
FIG. 19 shows a circuit and its timing critical region.

Circuit optimization depends on circuit context. Another small example of this is given in FIG. 19, which shows both forward delays (from FIG. 17) and backwards delays (from FIG. 18). For simplicity, gate delays are considered to have unit delays. One knowledgeable in the art would appreciate that other delay models could be used, possibly depending on output loads and signal slopes. A potentially critical timing zone is highlighted in FIG. 19 when one output has arrival time 45 (1913) and one of its outputs has a delay of 17 (1916). The highlighted path 1926 has delay 65. Both forward and backward delays are shown for each node. A required (by the designer) timing of 64 units is assumed. This path is composed of an AND2 cell 1929 followed by a NAND2 cell 1933 followed by a AND2 cell 1935. A person skilled in the art will appreciate that the delay at this path is 65. A person skilled in the art will also appreciate that this delay can be obtained by adding the forward and backward delays at each node. For instance, at a first node 1941 in the path the delay is 45+20=65; at a second node 1944 of the path the delay is 46+19=65; at a third node 1948 of the path the delay is 47+18=65; at a fourth node 1953 the delay is 48+17=65. Notice that this region is potentially timing critical because criticality also depends on design constraints. If the required timing is larger than 65, timing constraints are met and the region is not timing critical. However, if the required timing specified by the designer for the circuit is of 64 (for instance) then the timing is not met.

In this case, the path will have a negative slack of 1 unit, or a slack of −1. A person knowledgeable in the art will appreciate that this slack of −1 is a timing violation and it means that this region has to be optimized to reduce delays by one unit. The notion of slack is well known to people knowledgeable in the art. The slacks can be obtained with a timing analysis tool like Primetime from Synopsys, which is able to annotate all the values of slacks in intermediate nodes. Prime time was cited only for exemplification, other timing analysis tools could be used instead to do the same annotation.

Figure 20:
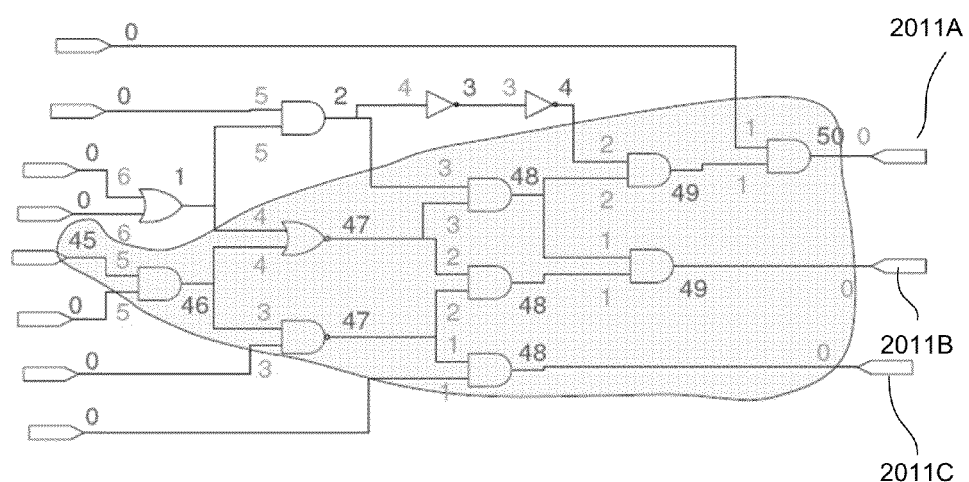
FIG. 20 shows a circuit and its timing critical region.

To exemplify how the timing critical region of the circuit changes with context, another example is provided in FIG. 20. In FIG. 20, all the outputs 2011A-2011C have the same output delay (or required arrival times). A required (by the designer) timing of 47 units is assumed. For simplicity, gate delays are considered to have unit delays. One knowledgeable in the art would appreciate that other delay models could be used, possibly depending on output loads and signal slopes. In this example it supposed that the user defined required timing for the circuit is of 47 delay units. In this case the nine different cells in the highlighted region will have a negative slack, meaning that this entire region has to be optimized for timing. The region that is not timing critical is not highlighted and it could be optimized for other goals (such as area and power).

One knowledgeable in the art will appreciate that the use of distinct library subsets can be useful for optimizing the circuit for different optimization goals (e.g., area, timing, power). In this way, it is possible to use different subsets of the library to do preliminary optimizations and analyze the results to decide which subsets (or parts of it) are more suitable to attain a given optimization goal. The preliminary optimizations are not intended to be final optimizations, but investigative optimizations aimed to help the discovery of subsets of the library (or parts of the subset) that are more suitable to attain a given optimization goal for the circuit under optimization. One knowledgeable in the art will appreciate that the use of distinct library subsets can be useful for optimizing different parts of the circuit (for instance timing critical regions and non-timing critical reasons) for different optimization goals (e.g., area, timing, power).

An example of an implementation during a sample runtime is presented following:

The techniques presented herein have been used in a commercial example with the following characteristics. The initial design was a very high volume processor core implemented using 33,000 instances and standard-cell area of 2.54 square millimeters, for which an area minimization was desired. The original library upon which the microprocessor core was designed was a 350-nanometer std-cell library with 398 cells.

Then a large library (ML350) composed of 5415 new cells using the same cell template as the original std-cell library was created. This new cell library was composed of drive strength variants, skew variants and topology variants of existing cells; new functionalities (e.g., new Boolean functions) were added, also considering drive strength variants, skew variants and topology variants of the added functionalities. The ML350 library was organized into six subset libraries in order to facilitate the subsequent optimization of the microprocessor core. These subset libraries are referred by the names Skew_Orig, Orig_Mod, SP1_SP3, Complex, combined and HD and they are briefly described in table III.

TABLE III

Cell subsets used in the library ML350.

| Subset name | Number of cells | Description |
|---|---|---|
| Skew_Orig | 2030 | Skew variants of cells from original library |
| Orig_Mod | 311 | Alternative topologies of cells from original library |
| SP1_SP3 | 2946 | New functions of type series-parallel with up to 3 transistor in series |
| Complex | 83 | New functions with complex Boolean function |
| Combined | 21 | New functions implemented as combined cells |
| HD | 24 | Alternative very high-density implementation of original cells |

The cells available in the Skew_Origin subset library are useful to provide skew variants that help to fix timing in paths with different raise and fall delays.

The cells in the Orig_Mod subset library are cells that have the same functionality (function ID), but different transistor topologies when compared to cells in the original library. They provide different area delay tradeoffs by presenting alternative topologies.

The cells in the SP1_SP3 subset library are new functions of type series-parallel with up to three transistor in series. These cells provide additional functionality with good density, as they are single or double stage series/parallel CMOS complex cells.

The cells in the "Complex" subset library are new functions with complex Boolean functions, possible not implementable as a single stage or double stage series/parallel complex cell (which was the case in the SP1_SP3 library).

The cells in the "combined" subset library are obtained by making combinations of cells already available in the original library.

The cells in the "HD" subset library are high-density implementations of cells in the original library.

When this new library (ML350) with 5415 new cells was provided as-is to the optimization engine, the engine (commercial synthesis and optimization tool) had execution runtime problems and was not able to reduce area by more than 2 percent.

By organizing the ML350 cell library into the listed subsets, it was possible to exploit portions of the library (e.g., library subsets) at a time. The optimization was run in five phases:

1. In the first phase cells from the library subsets Skew_Orig and Orig_Mod was selected based on an analysis of the input design in order to (dynamically) create a new subset library (lib1) being used for optimization. The library lib1 had 611 cells. Then an optimization algorithm was executed (iter_opt) using the original library and the subset library lib1. After the optimization the resulting design was saved (design1).

2. In the second phase cells from the SP1_SP3 library subset was selected based on an analysis of the design (design1) in order to (dynamically) create a new subset library (lib2) being used for optimization. This new library subset had 826 cells. Then an optimization algorithm was executed (iter_opt) using the original library and the subset libraries lib1 and lib2. After the optimization the resulting design was saved (design2).

3. In the third phase of the optimization cells from the Complex and Combined subset libraries were used together with the original library and library subsets lib1 and lib2 to further optimize the design. Two optimization algorithms were executed (peephole-remap and cluster-opt). After the optimization the resulting design was saved (design3).

4. In the fourth phase of the optimization the subset library HD was introduced along with all the subset libraries used in the prior optimization phases. Then an optimization algorithm was executed (iter-opt). After the optimization the resulting design was saved (design4).

5. In the fifth phase of the optimization the design4 was analyzed and a subset library (lib4) was created with the cells actually used in the implementation of the design4 from the ML350 library. Then the design was optimized with the goal of reducing the number of used extra cells (algorithm iter-prune). The final result was saved as design5. The used cells were saved in subset library lib5.

The area of design5 was reduced to 2.14 square millimeters corresponding to a 16 percent lower area of the input design and ended up using 638 cells in total from the library ML350 contained in the subset library lib5.

The use of a library organized into subsets made this optimization possible, as when the complete new library (ML350) with 5415 new cells was provided to the optimization engine as a complete undivided library, the engine (commercial synthesis and optimization tool) had execution runtime problems and was not able to reduce area by more than 2 percent.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
providing a plurality of cells in a cell library;
determining at least a first subset of cells of the plurality of cells in the cell library based on a first characteristic, wherein the characteristic comprises a logical functionality;
using at least one computer processor, using a second characteristic to determine from the first subset at least a second subset of the plurality of cells in the cell library, wherein a distribution of the second subset is arranged in a grid comprising rows and columns, at least the row or column is based on the second characteristic, and at an intersection of each row and column is a cell using a third characteristic to determine from the second subset a third subset of the plurality of cells in the cell library, wherein the third characteristic is different from the second characteristic; and
inputting to a cell-based synthesis engine the third subset, wherein the third subset comprises fewer cells than the cells in the cell library.

2. The method of claim 1 wherein the second characteristic comprises topology variants.

3. The method of claim 1 wherein the second characteristic comprises drive strength variants.

4. The method of claim 1 wherein the second characteristic comprises different internal sizing for cells with same drive strengths.

5. The method of claim 1 wherein not all the subsets are used in an optimization by the cell-base synthesis engine.

6. The method of claim 5 wherein distinct preliminary optimizations are done by using different combinations of library subsets.

7. The method of claim 6 wherein preliminary optimizations are analyzed, and a new composed library is produced by selecting a group of cells from the cell subsets used in the preliminary optimizations.

8. The method of claim 7 where the composed library is used to map a circuit.

9. The method for optimizing a circuit of claim 6 wherein the distinct preliminary optimizations are applied to different regions of a circuit being optimized.

10. The method for optimizing a circuit of claim 1 wherein a footprint compatible cell subsets are used in the backend optimization.

11. A method comprising:
providing a plurality of logic cells in a cell design library;
determining at least a first subset of logic cells of the plurality of logic cells in the cell design library based on a first characteristic, wherein the characteristic comprises a logical functionality;
using at least one computer processor, using a second characteristic to determine from the first subset at least a second subset of the plurality of logic cells in the cell design library wherein a distribution of the second subset is arranged in rows and columns, at least the row or column is based on the second characteristic, and at an intersection of a row and column is a logic cell;
using a third characteristic to determine from the second subset a third subset of the plurality of logic cells in the cell design library, wherein the third characteristic is different from the second characteristic;
inputting to a cell-based synthesis engine the third subset, wherein the third subset comprises fewer logic cells than the logic cells in the cell design library; and
performing distinct preliminary optimizations by using different combinations of library subsets.

12. The method of claim 11 comprising:
analyzing the preliminary optimizations; and
generating a new composed library by selecting a group of logic cells from the logic cell subsets used in the preliminary optimizations.

13. The method of claim 12 comprising:
using the composed library to map a circuit.

14. The method of claim 11 comprising:
applying the distinct preliminary optimizations to different regions of a circuit being optimized.

15. The method of claim 11 comprising:
using a footprint compatible logic cell subsets are used in a backend optimization, wherein a logic cell is footprint compatible with another logic cell if the input/output (I/O) connections of the logic cells are available at the same relative places at the interior of the logic cells.

16. The method of claim 11 wherein a cell in the cell design library comprises at least one PMOS transistor and at least one NMOS transistor.

17. The method of claim 11 comprising:
organizing the second subset cells in a distribution grid having a drive strength axis and a PN ratio axis and at each point in the distribution grid is a logic cell.

18. The method of claim 11 comprising:
selecting for the third subset a plurality of adjacent logic cells in the distribution grid.

19. The method of claim 11 comprising:
inputting to the cell-base synthesis engine the second subset, wherein the second subset comprises fewer logic cells than the logic cells in the cell design library.

* * * * *